United States Patent
Campini et al.

(10) Patent No.: US 7,525,219 B2
(45) Date of Patent: Apr. 28, 2009

(54) PROVIDING POWER TO A MODULE

(75) Inventors: Edoardo Campini, Mesa, AZ (US);
William Handley, Chandler, AZ (US);
Javier Leija, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 505 days.

(21) Appl. No.: 11/235,517

(22) Filed: Sep. 26, 2005

(65) Prior Publication Data

US 2007/0070566 A1    Mar. 29, 2007

(51) Int. Cl.
*H02J 1/00* (2006.01)
(52) U.S. Cl. .................................... 307/80
(58) Field of Classification Search ............ 307/80
See application file for complete search history.

(56) References Cited

U.S. PATENT DOCUMENTS 5,958,056 A  9/1999  Lehmann 6,448,672 B1  9/2002  Voegeli et al.
2003/0085621 A1*  5/2003  Potega .................... 307/18
2005/0088201 A1  4/2005  Devlin et al.

FOREIGN PATENT DOCUMENTS

WO  WO2007/038303  2/2007

OTHER PUBLICATIONS

International Preliminary Report on Patentability, PCT Application No. PCT/US2006/037041 (Publication No. WO 2007/038303), report issue date Mar. 26, 2008, 7 pages.

* cited by examiner

*Primary Examiner*—Robert L. Deberadinis
(74) *Attorney, Agent, or Firm*—Blakely, Sokoloff, Taylor & Zafman LLP

(57) ABSTRACT

A method to couple a module to a board including power circuitry. The method includes detecting a module's power requirements before providing payload power to the module and routing a regulated power level to the module via at least one power feed based on the detected power requirements. The regulated power is provided by the board's power circuitry.

26 Claims, 5 Drawing Sheets

PROVIDING POWER TO A MODULE

BACKGROUND

Computer systems may include modules that couple to boards. These modules may provide additional functionality to the board (e.g., additional processing power, storage, graphic capabilities, etc) and may couple to one or more power feeds routed from power circuitry resident on the board. In some computer systems, modules may contain components that operate using finely regulated voltages at various given voltage or payload power levels. Finely regulated power levels may result in power levels that are controlled within relatively narrow ranges, e.g. 5.0 volts+/−0.5, 3.3 volts+/−0.1, 1.0 volts+/−0.05, etc.

In one example, a module such as a mezzanine card may be received and coupled to a board such as a carrier board. Typically, the carrier board may provide a power level to the mezzanine card at a power level that may fluctuate widely between given voltages. For example, a carrier board may be designed to operate in compliance with industry standards such as the PCI Industrial Computer Manufacturers Group (PICMG), Advanced Telecommunications Computing Architecture (ATCA) Base Specification, PICMG 3.0 Rev. 1.0, published Dec. 30, 2002, or later versions of the specification ("the ATCA specification") and the Advanced Mezzanine Card (AMC) Specification, PICMG AMC.0, Revision 1.0, published Jan. 3, 2005, or later versions of the specification ("the AMC.0 specification). The ATCA/AMC.0 compliant carrier board may receive and couple to AMC.0 compliant mezzanine cards and thus is required to provide only one payload power level. This payload power level is permitted to fluctuate between 10 volts direct current (VDC) and 14 VDC. Additionally, the ATCA/AMC.0 carrier board may also provide a low or minimal power level for management power that is likely not sufficient to provide payload power to a typical AMC.0 mezzanine card or components resident on the mezzanine card.

DETAILED DESCRIPTION

As mentioned in the background, modules may contain components that operate using finely regulated power levels. In one example, the power level to provide payload power to a module coupled to an ATCA/AMC.0 compliant carrier board may fluctuate such that the module requires additional power circuitry to minimize these fluctuations. The module may also need additional power circuitry to provide the various power levels the components on the module may need to operate. This power circuitry (e.g., resistors, capacitors, power converters, voltage regulators, etc.) may consume a large portion of the available space resident on the module. As a result, the size or number of components placed on the module may be restricted based on the need to use module space to provide the various finely regulated power levels to the components.

In one example, for a module to couple to a board including power circuitry, the module's power requirements are detected before or prior to providing payload power to the module. A regulated power level may then be routed to the module via a power feed based on the detected power requirements. The board's power circuitry may provide the regulated power level.

Figure 1A:
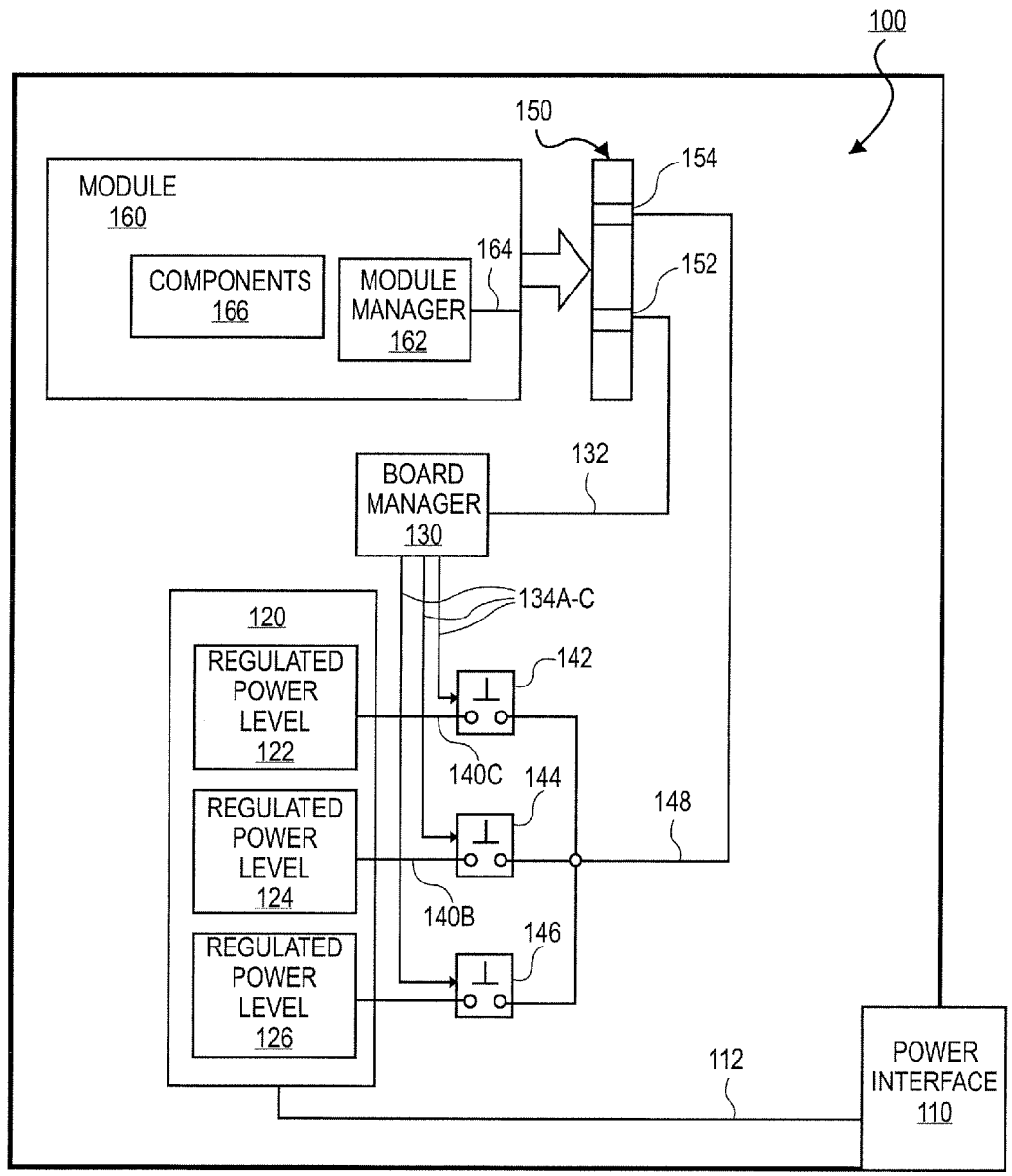
FIG. 1A is an example illustration of routing regulated power levels to a module.

FIG. 1A is an example illustration of routing regulated power levels to a module 160. In one example, as depicted in FIG. 1, module 160 is to be received and coupled to connector 150 on board 100. Board 100 includes a power interface 110. Power interface 110 may couple to a power source (not shown) that provides power to board 100. That power source may be routed through a backplane in a modular platform (see FIG. 3). Received power may then be routed via power feed 112 to power circuitry 120.

In one example, power circuitry 120 includes circuitry (not shown) to provide regulated power levels 122, 124 and 126, although this disclosure is not limited to only three power levels but may include any number of regulated power levels. As depicted in FIG. 1, regulated power levels 122, 124, and 126 couple to power feeds 140A, 140B and 140C, respectively. These power feeds, in one example, are coupled to power switches 142, 144 and 146. Power switches 142, 144, and 146 may include solid state power switches that are turned on/off or activated via communication links 134A-C coupled to board manager 130.

In one implementation, board manager 130 is also coupled via a communication link 132 to a communication interface 152 on connector 150. Module 160, in one example, includes a module manager 162 that couples to communication interface 152 via communication link 164. Module manager 162 may include or obtain access (e.g., to a memory) containing the power requirements needed to operate components 166 resident on module 160. These power requirements may include startup, runtime, and standby power levels for components 166. These power requirements may also include power levels beyond the minimum power levels (e.g., management power) needed to exchange management or control information between module 160 and board 100.

In one example, board manager 130 may detect module 160's power requirements before payload power (e.g., sufficient power to operate components 166) is provided by board 100 to module 160. Detection may occur as the result of module manager 162 forwarding the power requirements via communication link 164 upon or during the coupling of module 160 to board 100. These power requirements may be received by communication interface 152 and forwarded to board manager 130 (e.g., via communication link 132).

In one implementation, based on the detected power requirements, board manager 130 selectively activates power switches 142, 144 and 146 to route a regulated power level to module 160. Thus, in one example, when module 160 is received and coupled to connector 150, a regulated power level is routed through power interface 154 via power feed 148 from either regulated power level 122, 124 or 126.

In one implementation, a plurality of power feeds may route one or more regulated power levels to module 160. Each power feed may be coupled to a respective set of power switches coupled to each regulated power level. Although not shown in FIG. 1A or 1B, in one example, a power feed may couple to a set of power switches and another power feed may couple to another set of power switches. Both power feeds may then couple to respective power interfaces on connector 150. In this example, board manager 130 may selectively activate a power switch from among each of the power switch sets to route two regulated power levels via the two power feeds based on module 160's detected power requirements.

In one example, board 100 operates in compliance with the ATCA specification. In this example, board manager 130 is a management controller described in the ATCA specification as an Intelligent Platform Management Controller or "IPMC." As an IPMC, board manager 130 may perform management or control functions for components or modules that are coupled to or resident on board 100. Although this disclosure is not limited to only ATCA compliant boards but may also include boards compliant with other industry standards such as, Peripheral Component Interconnect (PCI), Compact Peripheral Component Interface (cPCI) compliant boards, VersaModular Eurocard (VME) compliant boards, or other types of industry standards governing the design and operation of boards Board 100 may also be compliant with the AMC.0 specification. So board manager 130 may relay management or control instructions to modules coupled to board 100 over a board management channel or bus. This board management bus is described in the AMC.0 specification as the Intelligent Platform Management Bus—Local or "IPMB-L". An AMC.0 IPMB-L may operate using communication protocols described in the "Intelligent Platform Management Bus Communications Protocol Specification," Document Revision 1.0, published Nov. 15, 1999, or later versions of the standard (the "IPMB specification"). In one example, communication link 132 may serve as the IPMB-L for ATCA/AMC.0 compliant board 100. Communication link 132 may also operate using the IPMB specification in other implementations where board 100 and module 160 are operating in compliance with other industry standards that also may use the IPMB specification to relay management or control information.

The AMC.0 specification further describes that modules coupled to a compliant board contain module management controllers or "MMCs". In one example, module manager 162 serves as an AMC.0 MMC for module 160 and couples to board manager 130 through communication interface 152 via communication link 132. Since communication link 132 may serve as an IPMB-L, module manager 162 may forward module 160's power requirements to board manager 130 using communication protocols described in the IPMB specification.

In one implementation, communication interface 152 may include the means to detect wireless signals (e.g., radio, infrared, LASAR, etc.) transmitted from a device on module 160. Although not shown in FIG. 1A or 1B, communication interface 152 includes a Radio Frequency Identification (RFID) reader/interrogator (e.g., an antenna, transceiver and decoder). The RFID reader/interrogator may emit radio signals to activate and read a Radio Frequency (RF) tag (not shown) resident on or associated with module 160. This RF tag information may include module 160's power requirements. Communication interface 152 may then forward Module 160's power requirements to board manager 130 via communication link 132.

In another example, an RFID reader/interrogator is responsive to or included within board manager 130. This RFID reader/interrogator may activate and read the RF tag resident or associated with module 160. Thus, in this other example, board manager 130 directly reads the RF tag information to detect module 160's power requirements without using an RFID reader/interrogator in communication interface 152.

Figure 1B:
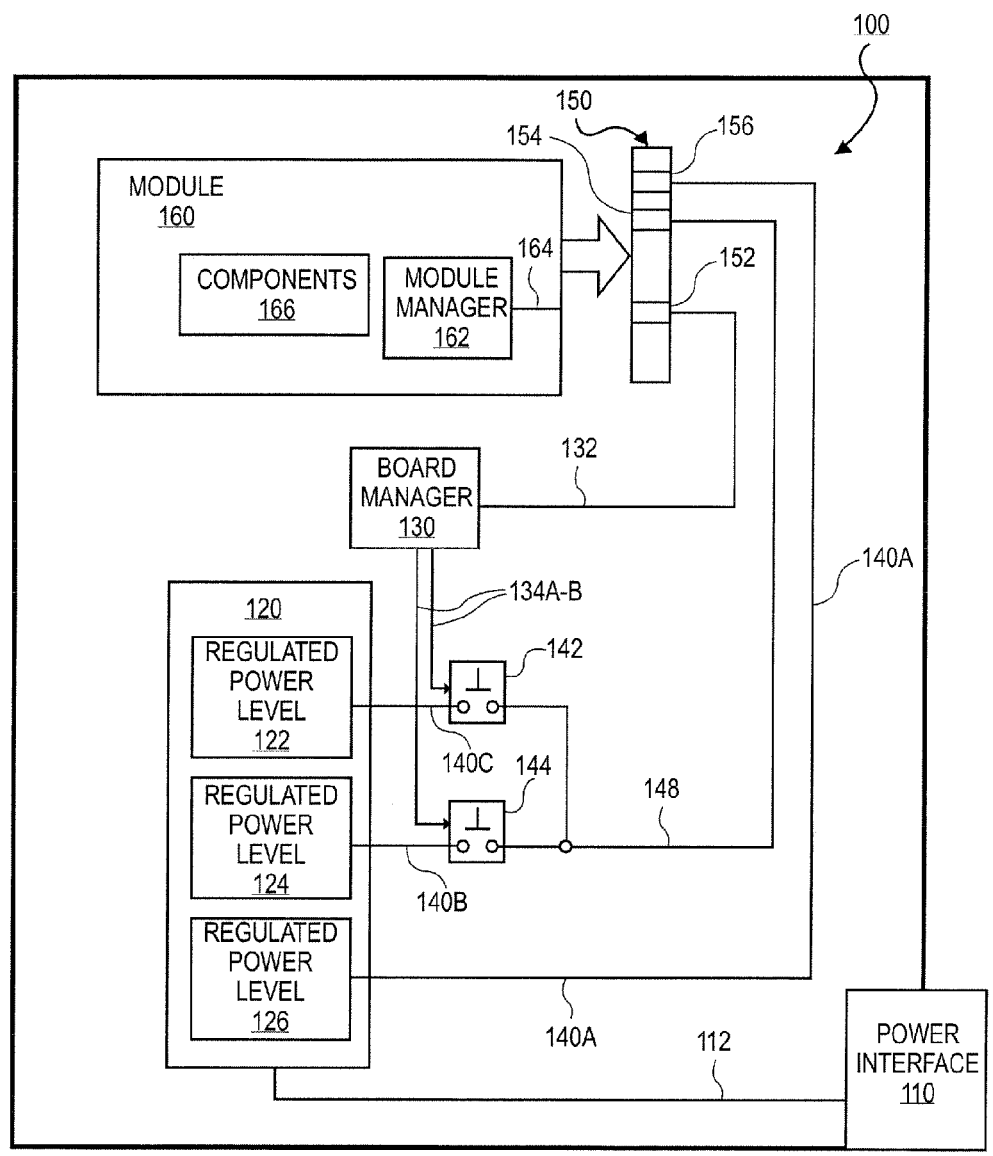
FIG. 1B is another example illustration of routing regulated power levels to the module.

FIG. 1B is another example illustration of routing regulated power levels to module 160. As depicted in FIG. 1B, power feeds 148 and 140A route regulated power from regulated powers levels 122, 124, and 126 through power interfaces 154 and 156 to module 160.

In one implementation, an ATCA/AMC.0 compliant board 100 provides a regulated power level of 12 VDC+/−2 VDC via power feed 140A to an AMC.0 compliant module 160. According to the AMC.0 specification, specific pins or contacts on compliant mezzanine cards are to be provided with a power level of 12 VDC to provide payload power to the module or components on the model (e.g., components 166). Thus, regulated power level 126 may provide a regulated power level of 12 VDC+/−2 VDC via power feed 140A to these specific contacts through power interface 156. In addition, power switches 142 and 144 may be selectively asserted by board manager 130 to provide additional regulated power levels via power feed 148. Power feed 148 may couple to power interface 154.

In one implementation, power interface 154 receives and couples to contacts on AMC.0 compliant module 160 reserved for "Extended Options" as described in the AMC.0 specification. Thus, ATCA/AMC.0 compliant board 100 can provide a regulated 12 VDC power level via power interface 156 to AMC.0 compliant module 160 to meet the AMC.0's payload power requirements and yet also provide additional regulated power levels to contacts reserved for "Extended Options" via power interface 154.

In one example, board manager 130 detects module 160's power requirements as described above in FIG. 1A. However, in this example, regulated power levels 122 and 124 are routed to module 160 based on the detected power requirements and the power level provided by regulated power level 126 (e.g., 12 VDC) is a fixed or predetermined power requirement. Thus, board 100 can still provide a power level (e.g., 12 VDC) from regulated power level 126 even if board 100 cannot detect the power requirements of module 160. Thus in an ATCA/AMC.0 scenario, AMC.0 compliant modules that lack the functionality to communicate to board 100 their power requirements can still receive the AMC.0 mandated regulated 12 VDC payload power level.

In one implementation, board 100 includes a plurality of connectors 150 to receive and couple to additional modules that are also designed and operated in compliance with the AMC.0 specification. These connectors 150 may also couple to power feeds in the same manner as described above for power feed 148 or power feed 140A in FIG. 1A and FIG. 1B. Thus, power circuitry 120 may provide regulated power levels 122, 124 and 126 to these additional modules as described above for module 160.

Figure 2:
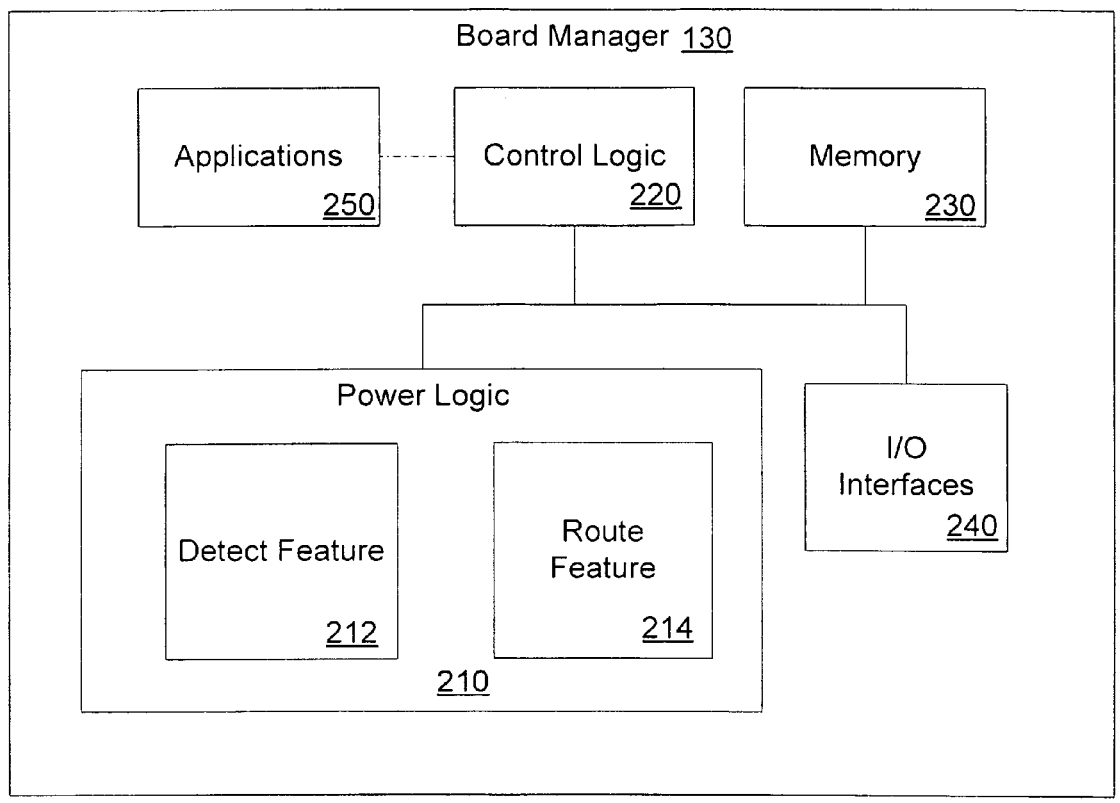
FIG. 2 is a block diagram of an example architecture for a board manager.

FIG. 2 is a block diagram of an example architecture for board manager 130. Board manager 130 includes a power logic 210, control logic 220, memory 230, I/O interface 240, and optionally one or more applications 250, each coupled as depicted.

In one implementation, power logic 210 includes a detect feature 212 and a route feature 214. In one example, detect feature 212 detects a module's (e.g., module 160) power requirements before payload power is provided to the module. Route feature 214 may then route one or more regulated power levels to the module via a power feed based on the power requirements detected by detect feature 212.

Control logic 220 controls the overall operation of board manager 130. In some implementations, the features and functionality of control logic 220 may well be implemented within power logic 210.

Memory 230 may represent a wide variety of memory media including, but not limited to volatile memory, non-volatile memory, flash and programmatic variables or states.

According to one example, memory 230 is used to temporarily store detected power requirements for one or more modules.

I/O interfaces 240 provide a communication interface between board manager 130 and elements resident on or remote to a board. In one example, resident elements on board 100 include power switches 142-146, power circuitry 120, communication interface 152 and remote elements may include an RFID RF tag on a module to be received and coupled to board 100. Remote elements may also include other boards or computer systems coupled to board 100, for example, via a backplane in a modular platform (see FIG. 3). As a result control logic 220 can receive a series of instructions from application software external to board manager 130 via I/O interfaces 240. The series of instructions may activate control logic 220 to implement one or more features of power logic 210.

In one implementation, board manager 130 includes one or more applications 250 to provide instructions to control logic 220. Such applications 250 may well be activated to generate a user interface, e.g., a graphical user interface (GUI), to enable administration features, and the like.

Figure 3:
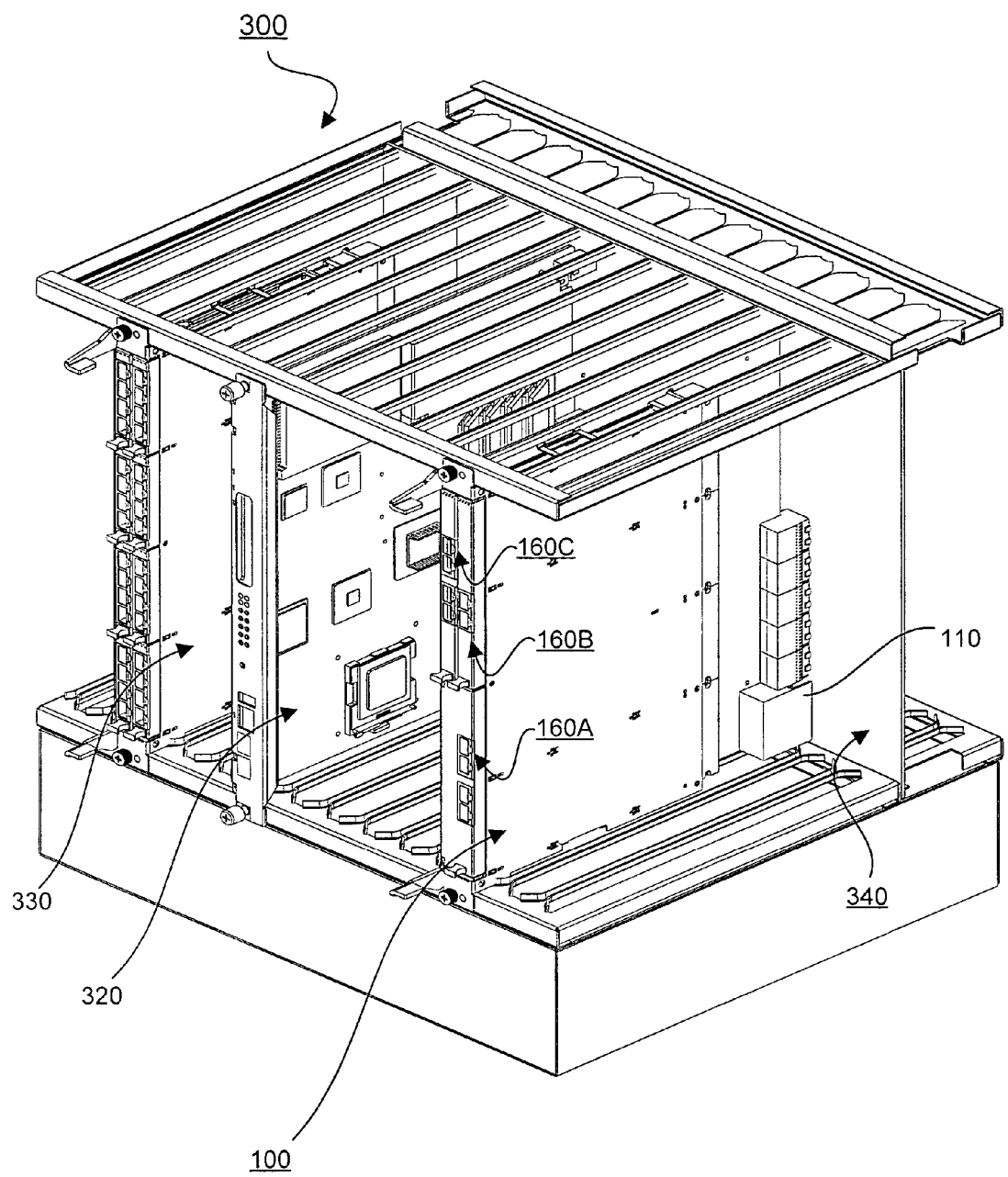
FIG. 3 provides a partial view of an example modular platform.

FIG. 3 provides a partial view of an example modular platform 300. Modular platform 300 may be a telecommunications server designed to be compliant with the ATCA specification, although modular platforms discussed in this disclosure are not limited to only ATCA compliant modular platforms. FIG. 3 shows a partial view of modular platform 300 having selected portions removed for clarity and including boards 100, 320 and 330 coupled to backplane 340.

Also depicted in FIG. 3 are modules 160A-C received and coupled to board 100.

In one example, as described above and depicted in FIG. 1A and FIG. 1B, board 100 includes a power interface 110 which couples to backplane 340 to provide power to board 100.

In an ATCA compliant board 100, an ATCA compliant backplane 340 provides −48 VDC through power interface 110. This −48 VDC may be routed via power feed 112 to power circuitry 120. Power circuitry 120 may contain circuitry to convert the −48 VDC to various regulated power levels (e.g., regulated power levels 122, 124, 126). These regulated power levels may then be routed to other components on board 100 or to modules (e.g., modules 160A-C) received and coupled to connectors on board 100. Although this disclosure is not limited to only −48 VDC but may include any type of power (positive, negative, direct current or alternating current) provided by backplane 340 to board 100.

Figure 4:
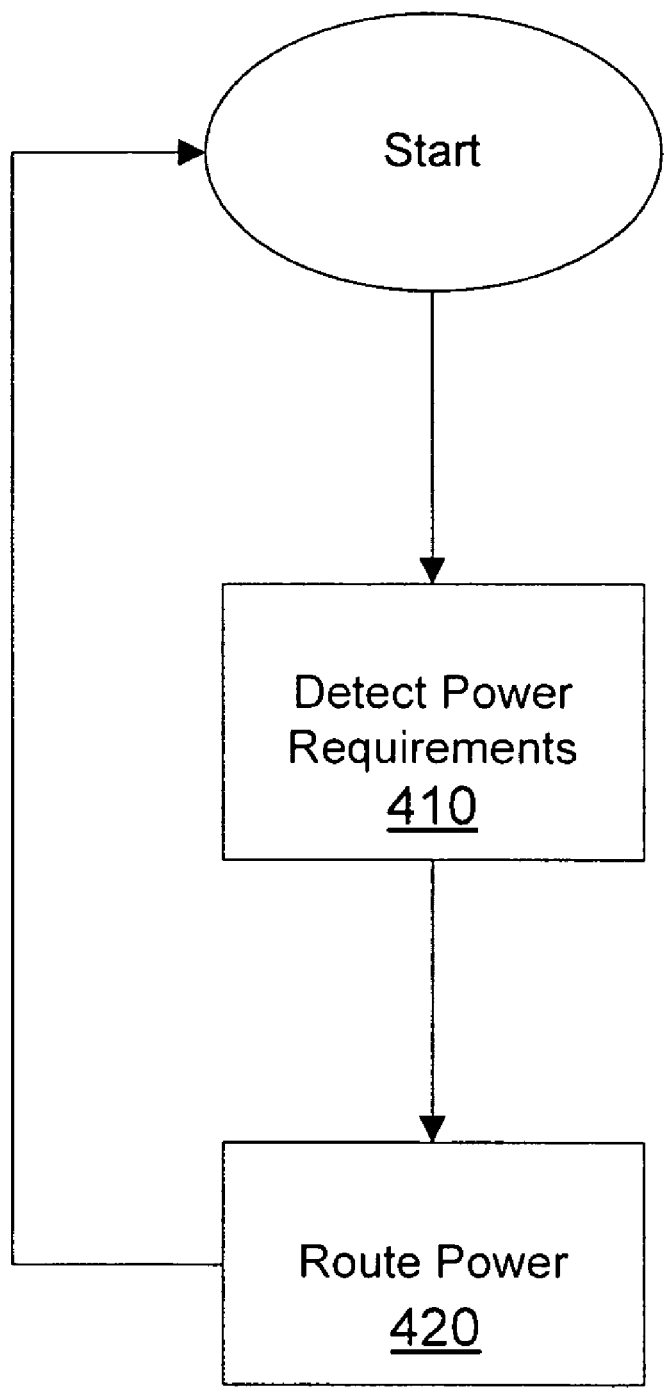
FIG. 4 is a flow chart of an example method to detect a module's power requirements and to route power to the module.

FIG. 4 is a flow chart of an example method to detect module 160A's power requirements and to route power to module 160A. In this example, board 100 is received and coupled to backplane 340 as depicted in FIG. 3. In this example method, modular platform 300 and board 100 operate or are designed to operate in compliance with the ATCA specification. In addition, board 100 and modules 160A-C may operate or are designed to operate in compliance with the AMC.0 specification. Modules 160A-C, in this example method, include the same elements as described in FIG. 1A and FIG. 1B.

In block 410, in one example, module 160A is to be received and coupled to connector 150 after board 100 is received and coupled to backplane 340. In this example, module manager 162 may forward module 160A's power requirement information (e.g., via an IPMB-L or wireless communication link) to board manager 130. This power requirement information may include the various regulated power levels that components 166 on module 160A may need to operate as designed, e.g., 12 VDC+/−2 VDC, 5.0 VDC+/−0.5 VDC, 3.3 VDC+/−.3 VDC, etc.

Upon receiving the information, board manager 130 activates power logic 210. Power logic 210 then activates detect feature 212 to detect or interpret module 160A's power requirements. For example, detect feature 212 receives module 160A's power requirements from module management controller 162 via communication link 132. As described above, communication link 132 may be a management channel or bus operated in compliance with the IPMB specification. In another example, detect feature 212 may receive module 160A's power requirements via a communication link associated with RFID. Thus, in this other example, an RFID reader/interrogator responsive to or included within detect feature 212 emits radio signals to activate an RF tag on module 160A. The RFID reader/interrogator may then read/detect information included in the RF tag. This information may include module 160A's power requirements. Detect feature 212 may then temporarily store (e.g., in memory 230) the detected power requirements that were detected via an IPMB or with an RFID reader/interrogator.

In another example, module 160A is received and coupled to connector 150 (not shown) on board 100 prior to board 100 being coupled to backplane 340. In this example, module manager 162 may forward module 160A's power requirement information after power-up of board 100.

In block 420, following module 160A's coupling to connector 150, power logic 210 activates route feature 214. In one example, this activation of route feature 214 may occur after an AMC.0 compliant module 160A has completed the start up requirements up until the point that module 160A is ready to receive its payload power level(s) (e.g., ready to be fully powered or is enabled). Route feature 214 may access the power requirement information temporarily stored by detect feature 212 (e.g., in memory 230). Based on the power requirement information, route feature 214 may selectively activate power switches 142, 144, and 146 to route regulated power level to module 160A via power feed 148.

The process then starts over, for example, when another module is to be received and coupled to board 100 or board 100 is removed from backplane 340 and then received and coupled again to either backplane 340 or another backplane in a modular platform.

Referring back to FIGS. 1A-B and FIG. 2. Board manager 130 and module manager 162 may include but are not limited to microprocessors, microcontrollers, field programmable gate arrays (FPGAs), application specific integrated circuits (ASICs), or executable content to implement such management/control features described in this disclosure, or any combination of the above.

Memory 230 may include a wide variety of memory media including but not limited to volatile memory, non-volatile memory, flash, programmable variables or states, random access memory (RAM), read-only memory (ROM), flash, or other static or dynamic storage media.

In one example, machine-readable instructions can be provided to memory 230 from a form of machine-accessible medium. A machine-accessible medium may represent any mechanism that provides (i.e., stores or transmits) information in a form readable by a machine (e.g., an ASIC, special function controller or processor, FPGA or other hardware device). For example, a machine-accessible medium may include: ROM; RAM; magnetic disk storage media; optical storage media; flash memory devices; electrical, optical, acoustical or other form of propagated signals (e.g., carrier waves, infrared signals, digital signals); and the like.

In the previous descriptions, for the purpose of explanation, numerous specific details were set forth in order to provide an understanding of this disclosure. It will be apparent that the disclosure can be practiced without these specific details. In other instances, structures and devices were shown in block diagram form in order to avoid obscuring the disclosure.

References made in the specification to the term "responsive to" are not limited to responsiveness to only a particular feature or structure. A feature may also be "responsive to" another feature or structure and also be located within that feature or structure. Additionally, the term "responsive to" may also be synonymous with other terms such as "communicatively coupled to" or "operatively coupled to," although the term is not limited in his regard.

What is claimed is:

1. A method to couple a module to a board including power circuitry, comprising:
   detecting the module's power requirements before providing payload power to the module;
   routing a regulated power level to the module via a power feed based on the detected power requirements, wherein the regulated power level is provided by the board's power circuitry; and
   routing another regulated power level to the module via another power feed based on a fixed power requirement, the other regulated power level from among the plurality of regulated power levels.

2. A method according to claim 1, wherein routing the regulated power level comprises activating a switch coupled between the regulated power level and the power feed.

3. A method according to claim 1, wherein detecting the module's power requirements comprises receiving the module's power requirements via a communication link.

4. A method according to claim 3, wherein the communication link is a management bus.

5. A method according to claim 3, wherein the communication link comprises a communication link associated with Radio Frequency Identification (RFID), wherein the module includes a Radio Frequency tag and the board includes an RFID reader to emit radio signals to activate the module's Radio Frequency tag and to read information in the Radio Frequency tag, the information including the module's power requirements.

6. A method according to claim 1, wherein the board comprises a carrier board and the module comprises a mezzanine card, both the carrier board and the mezzanine card to operate in compliance with the Advanced Mezzanine Card specification, the carrier board to also operate in compliance with the Advanced Telecommunications Computing Architecture specification.

7. A board comprising:
   power circuitry to provide a plurality of regulated power levels;
   a power feed to couple to the plurality of regulated power levels;
   a power logic to detect a module's power requirements before payload power is provided to the module and to route a regulated power level to the module via the power feed based on the detected power requirements, the regulated power level from among the plurality of regulated power levels; and
   another power feed to couple to the plurality of regulated power levels, wherein the power logic routes another regulated power level to the module via the other power feed based on a fixed power requirement, the other regulated power level from among the plurality of regulated power levels.

8. A board according to claim 7, wherein the power logic to detect the module's power requirements comprises the power logic to detect the module's power requirements by receiving the module's power requirements via a management bus communication link.

9. A board according to claim 7, wherein the power logic to detect the module's power requirements comprises the power logic to detect the module's power requirements by receiving the module's power requirements via a communication link, the communication link associated with Radio Frequency Identification (RFID), wherein the module includes a Radio Frequency tag and the power logic includes an RFID reader to emit radio signals to activate the module's Radio Frequency tag and to read information in the Radio Frequency tag, the information including the module's power requirements.

10. A board according to claim 7, wherein the power logic is to activate a switch coupled to the regulated power level to route the regulated power level to the module via the power feed based on the detected power requirements.

11. A board according to claim 7, wherein the board comprises a carrier board and the module comprises a mezzanine card, both the carrier board and the mezzanine card to operate in compliance with the Advanced Mezzanine Card specification, the carrier board to also operate in compliance with the Advanced Telecommunications Computing Architecture specification.

12. A board according to claim 11, the carrier board to include an Intelligent Platform Management Controller and the mezzanine card to include a Module Management Controller, the Intelligent Platform Management Controller to include the power logic to detect the mezzanine card's power requirements, wherein the mezzanine card's power requirements are forwarded by the Module Management Controller to the power logic via a communication link, the communication link to operate in compliance with the Intelligent Platform Management Bus Communications Protocol specification.

13. A system comprising:
   a module; and
   a board including:
      power circuitry to provide a plurality of regulated power levels,
      a power feed to couple to the plurality of regulated power levels,
      a power logic to detect the module's power requirements before payload power is provided to the module and to route a regulated power level to the module via the power feed based on the detected power requirements, the regulated power level from among the plurality of regulated power levels; and
      another power feed to couple to the plurality of regulated power levels, the other power feed to provide another regulated power level to the module based on a fixed power requirement, the other regulated power level from among the plurality of regulated power levels.

14. A system according to claim 13, wherein the power logic to detect the module's power requirements comprises the power logic to detect the module's power requirements by receiving the module's power requirements via a management bus communication link.

15. A system according to claim 13, wherein the power logic to detect the module's power requirements comprises the power logic to detect the module's power requirements by receiving the module's power requirements via a communication link, the communication link associated with Radio Frequency Identification (RFID), wherein the module includes a Radio Frequency tag and the power logic includes an RFID reader to emit radio signals to activate the module's Radio Frequency tag and to read information in the Radio Frequency tag, the information including the module's power requirements.

16. A system according to claim 13, the board comprising a carrier board and the module comprising a mezzanine card, both the carrier board and the mezzanine card to operate in compliance with the Advanced Mezzanine Card specification, the carrier board to also operate in compliance with the Advanced Telecommunications Computing Architecture specification, wherein the power feed is to couple to contacts on the mezzanine card that are assigned to Extended Options in the Advanced Mezzanine Card specification.

17. A system according to claim 16, wherein the carrier board routes the other regulated power level to the mezzanine card via the other power feed based on a fixed payload power requirement determined based on payload power requirements in the Advanced Mezzanine Card specification.

18. A machine-accessible medium comprising content, which, when executed by a machine causes the machine to:
    detect a module's power requirements before payload power is provided to the module;
    route a regulated power level to the module via a power feed based on the detected power requirements, wherein the regulated power level is provided by the board's power circuitry; and
    route another regulated power level to the module based on a fixed power requirement, the other regulated power level from among the plurality of regulated power levels.

19. A machine-accessible medium according to claim 18, wherein to detect the module's power requirements comprises to receive the module's power requirements via a communication link.

20. A machine-accessible medium according to claim 19, wherein the communication link is a management bus.

21. A machine-accessible medium according to claim 18, wherein to route the regulated power level comprises to activate a switch coupled between the regulated power level and the power feed.

22. A module to couple to a board having power circuitry, the module comprising:
    a module management controller to indicate to the board the module's power requirements prior to the board providing payload power, wherein based on the indicated power requirements, the board is to route a regulated power level to the module via a power feed, the regulated power level to be provided by the board's power circuitry, and the board is to route another regulated power level to the module based on a fixed power requirement, the other regulated power level provided by the board's power circuitry.

23. A module according to claim 22, wherein to detect the module's power Requirements comprises to detect the module's power requirements by receiving the module's power requirements via a management bus communication link on the board.

24. A module according to claim 22, wherein to detect the module's power requirements comprises to detect the module's power requirements by receiving the module's power requirements via a communication link, the communication link associated with Radio Frequency Identification (RFID), wherein the module includes a Radio Frequency tag and the board includes an RFID reader to emit radio signals to activate the module's Radio Frequency tag and to read information in the Radio Frequency tag, the information including the module's power requirements.

25. A module according to claim 22, wherein the module comprises a mezzanine card and the board comprises a carrier board, both the mezzanine card and the carrier board to operate in compliance with the Advanced Mezzanine Card specification, the carrier board to also operate in compliance with the Advanced Telecommunications Computing Architecture specification.

26. A module according to claim 25, the carrier board to include an Intelligent Platform Management Controller, the Intelligent Platform Management Controller to include power logic to detect the mezzanine card's power requirements, wherein the mezzanine card's power requirement are forwarded by the module management controller to the power logic via a communication link on the board, the communications link to operate in compliance with the Intelligent Platform Management Bus Communications Protocol specification.

* * * * *